United States Patent
Hatakeyama et al.

(10) Patent No.: US 11,079,228 B2
(45) Date of Patent: Aug. 3, 2021

(54) DETECTOR WITH CATCH AND RELEASE MECHANISM

(71) Applicant: KABUSHIKI KAISHA TOSHIBA, Minato-ku (JP)

(72) Inventors: Yohei Hatakeyama, Yokohama (JP); Tetsuro Itakura, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 307 days.

(21) Appl. No.: 16/119,744

(22) Filed: Aug. 31, 2018

(65) Prior Publication Data

US 2019/0234737 A1 Aug. 1, 2019

(30) Foreign Application Priority Data

Jan. 26, 2018 (JP) .............................. JP2018-011924

(51) Int. Cl.
*G01C 19/5733* (2012.01)
*G01C 19/5726* (2012.01)
(Continued)

(52) U.S. Cl.
CPC ..... *G01C 19/5733* (2013.01); *G01C 19/5726* (2013.01); *G01C 19/5776* (2013.01); *G01R 33/0029* (2013.01); *G01R 33/02* (2013.01)

(58) Field of Classification Search
CPC ............ G01C 19/5733; G01C 19/5776; G01C 19/5726; G01R 33/0029; G01R 33/02
See application file for complete search history.

(56) References Cited

U.S. PATENT DOCUMENTS

| 7,779,687 B2* | 8/2010 | Murashima | ........ G01C 19/5607 73/504.12 |
| 2003/0039325 A1* | 2/2003 | Watanabe | .......... G01C 19/5649 375/346 |

(Continued)

FOREIGN PATENT DOCUMENTS

| JP | 7-221802 | 8/1995 |
| JP | 2003-65768 A | 3/2003 |

(Continued)

OTHER PUBLICATIONS

Ryunosuke Gando et al., "An Intermittent Free-Vibration MEMS Gyroscope Enabled by Catch-and-Release Mechanism for Low-Power and Fast-Startup Applications", 2017 IEEE 30th International Conference on Micro Electro Mechanical Systems (MEMS), Jan. 22-26, 2017, pp. 29-32.

*Primary Examiner* — David Z Huang
(74) *Attorney, Agent, or Firm* — Oblon, McClelland, Maier & Neustadt, L.L.P.

(57) ABSTRACT

According to one embodiment, a detector is disclosed. The detector has a mechanism with first and second vibrators which vibrate in first and second directions. Circuits detect output first and second signals conforming to the detected positions of the vibrators. A detection circuit detects second signal using the first signal as a reference of synchronous detection and outputs a detection signal. A filter continues a moving average process on the detection signal for a period set based on the first signal. A controller circuitry controls the mechanism to causes the first vibrator to start vibrating in the first direction in synchronization with a clock signal.

12 Claims, 7 Drawing Sheets

(51) Int. Cl.
*G01R 33/00* (2006.01)
*G01R 33/02* (2006.01)
*G01C 19/5776* (2012.01)

(56) References Cited

U.S. PATENT DOCUMENTS

2016/0258753 A1  9/2016  Kanemoto
2016/0282116 A1  9/2016  Haneda

FOREIGN PATENT DOCUMENTS

| | | |
|---|---|---|
| JP | 2007-327943 A | 12/2007 |
| JP | 4032681 B2 | 1/2008 |
| JP | 2009-258047 A | 11/2009 |
| JP | 2016-161451 A | 9/2016 |
| JP | 2016-178601 | 10/2016 |

* cited by examiner

US 11,079,228 B2

DETECTOR WITH CATCH AND RELEASE MECHANISM

CROSS-REFERENCE TO RELATED APPLICATIONS

This application is based upon and claims the benefit of priority from Japanese Patent Application No. 2018-011924, filed Jan. 26, 2018, the entire contents of which are incorporated herein by reference.

FIELD

Embodiments described herein relate generally to a detector.

BACKGROUND

A detector provided with a mechanical vibrator is known. This type of detector uses mechanical resonance to detect a physical quantity (e.g., angular velocity). In order to detect an accurate physical quantity, it is necessary to remove a quadrature error component after synchronous detection using a low-pass filter (LPF). A LPF requires a large capacitor element. On the other hand, there has been proposed an analog moving average filter that can constitute a LPF without using a large capacitor element. However, in a sensor using mechanical resonance, variations in the start time of moving average (sampling jitter) lead to reduction in the accuracy of detection. Thus, there is a demand for a detector that is provided with a mechanical vibrator and capable of reducing the sampling jitter.

DETAILED DESCRIPTION

Figure 1:
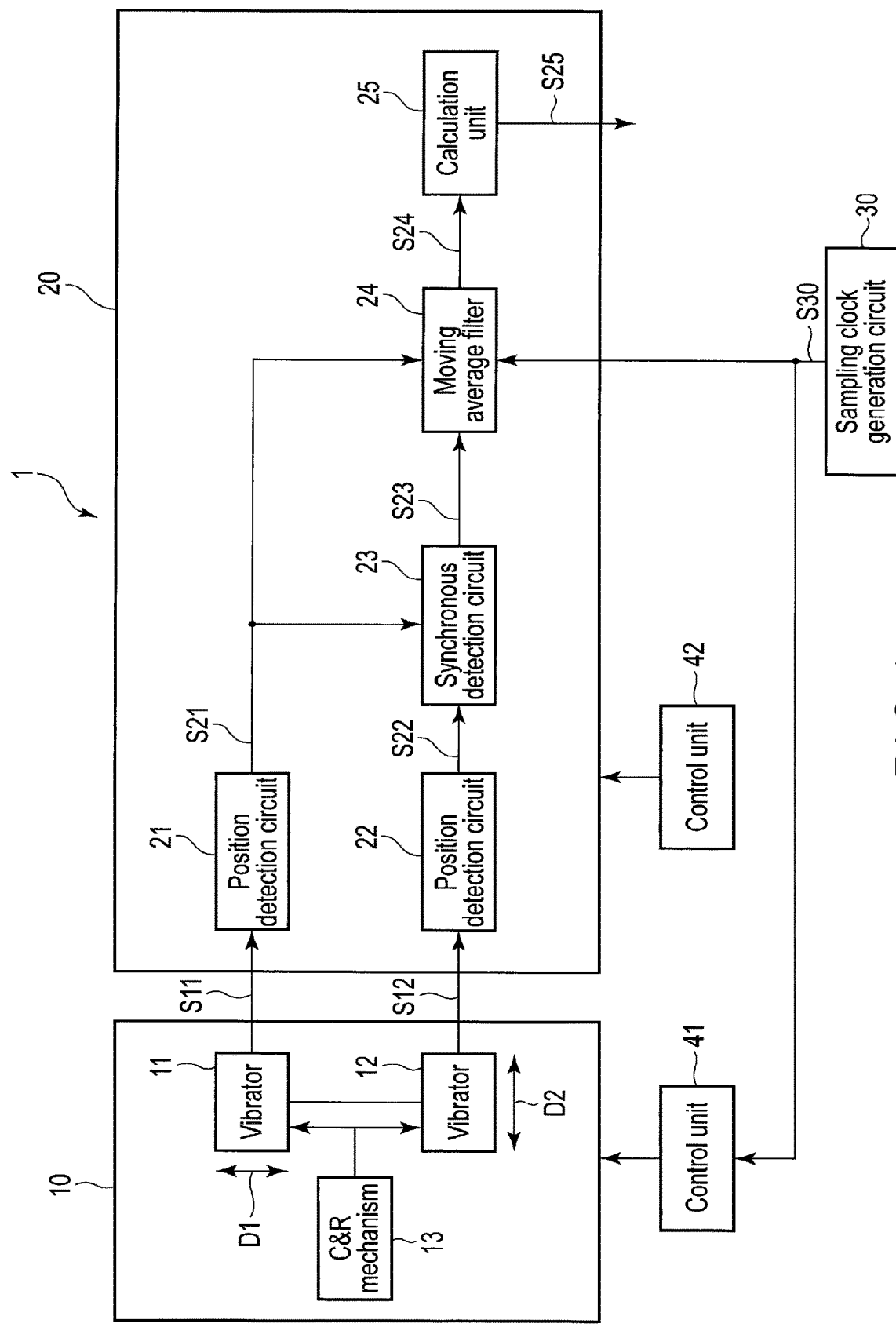
FIG. 1 is a diagram schematically illustrating a detector according to a first embodiment.

In general, according to one embodiment, a detector is disclosed. The detector includes a vibration mechanism, a first circuit, a second circuit, a detection circuit, a filter, and a first controller circuitry. The vibration mechanism includes a first mechanical vibrator which vibrates in at least a first direction, and a second mechanical vibrator which is mechanically connected to the first mechanical vibrator and vibrates in at least a second direction perpendicular to the first direction. The first circuit detects a first position of the first mechanical vibrator in accordance with the first direction and outputs a first signal corresponding to the detected first position. The first signal includes a first frequency. The second circuit detects a second position of the second mechanical vibrator in accordance with the second direction and outputs a second signal corresponding to the detected second position. The detection circuit detects the second signal by using the first signal as a reference of synchronous detection and outputs a detection signal. The filter continues on a moving average process on the detection signal according to a clock signal and for a period set based on the first signal. The first controller circuitry controls the vibration mechanism to cause the first mechanical vibrator to start vibrating in the first direction in synchronization with the clock signal and continue the started vibration for the period.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

FIG. 1 is a diagram schematically illustrating a detector 1 according to a first embodiment.

The detector 1 is a gyro sensor that detects an angular velocity generated when rotation occurs. The detector 1 includes a mechanical vibration mechanism 10, an angular velocity detection unit (circuitry) 20, a sampling clock generation circuit 30, a first control unit (circuitry) 41, and a second control unit (circuitry) 42.

The mechanical vibration mechanism 10 includes a first mechanical vibrator (drive vibrator) 11 which vibrates in at least a first direction D1 and a second mechanical vibrator (sense vibrator) 12 which vibrates at least a second direction D2 perpendicular to the first direction D1. The second mechanical vibrator 12 is mechanically connected to the first mechanical vibrator 11.

The first mechanical vibrator 11 is a movable electrode that is one of elements constituting a micro-electromechanical systems (MEMS) type variable capacitor (hereinbelow, referred to as the MEMS capacitor). The movable electrode is connected to one end of a spring (mechanical element). The movable electrode vibrates in the first direction D1 by extension and contraction of the spring. The other end of the spring is connected onto a substrate through a support member that is called an anchor. The movable electrode is disposed to face a fixed electrode that is fixed onto the substrate. The spring, the support member, the substrate, and the fixed electrode are elements that constitute the MEMS capacitor, similar to the movable electrode.

The distance between the movable electrode and the fixed electrode changes with the vibrations of the movable electrode in the first direction D1, and a capacitance between the movable electrode and the fixed electrode changes. That is, the capacitance of the MEMS capacitor changes according to the position (displacement) in the first direction D1 of the movable electrode, which is the first mechanical vibrator 11. The mechanical vibration mechanism 10 is configured to output a signal S11 corresponding to the capacitance (the position in the first direction D1).

The mechanical vibration mechanism 10 further includes a catch and release mechanism (C&R mechanism) 13. The catch and release mechanism 13 catches the first mechanical vibrator 11 in vibrating, and releases the caught first mechanical vibrator 11 to start vibration of the first mechanical vibrator 11.

When a force for generating rotation acts on the first mechanical vibrator 11 (the mechanical vibration mechanism 10) in a period during which the first mechanical vibrator 11 vibrates in the first direction D1, then a force (Coriolis force) having a direction parallel to the second direction D2 acts on the first mechanical vibrator 11. The second mechanical vibrator 12, which is mechanically connected to the first mechanical vibrator 11, vibrates in the second direction D2 by the Coriolis force. The rotation described above also includes a rotation of less than one turn (360°).

The second mechanical vibrator 12 constitutes a MEMS capacitor similarly to the first mechanical vibrator 11. The capacitance of the MEMS capacitor changes according to the position (displacement) in the second direction D2 of the second mechanical vibrator 12. The mechanical vibration mechanism 10 outputs a signal S12 corresponding to the capacitance (the position in the second direction D2). A disturbance signal called a quadrature error is superimposed on the signal S12. The disturbance signal has a frequency equal to the frequency of a signal (desired signal) corresponding to an angular velocity desired to be detected, but has a phase shift of 90° with respect to the desired signal.

The angular velocity detection unit 20 is configured to acquire an angular velocity of the rotation generated in the first mechanical vibrator 11 based on the output signals S11, S12 of the mechanical vibration mechanism 10. Hereinbelow, the angular velocity detection unit 20 will be further described.

The angular velocity detection unit 20 includes a first position detection circuit 21 for detecting the position in the first direction D1 of the first mechanical vibrator 11 (the first position of the first mechanical vibrator in accordance with the first direction) and a second position detection circuit 22 for detecting the position in the second direction D2 of the second mechanical vibrator 12 (the second position of the second mechanical vibrator in accordance with the second direction).

The signal S11 (capacitance) is input to the first position detection circuit 21. The first position detection circuit 21 detects the position in the first direction D1 of the first mechanical vibrator 11 based on the signal S11 (capacitance) and outputs a signal (first signal) S21 corresponding to the detected position. The signal S21 includes a resonance frequency f (first frequency) of the first mechanical vibrator 11. While the first mechanical vibrator 11 is vibrating in the first direction D1, the first position detection circuit 21 outputs the signal S21.

Similarly, the second position detection circuit 22 detects the position in the second direction D2 of the second mechanical vibrator 12 based on the signal S12 (capacitance) and outputs a signal (second signal) S22 corresponding to the detected position. The signal S22 includes a component I that is obtained by modulating a resonance frequency component by an angular velocity and a component Q by the quadrature error. The angular velocity is an angular velocity of the rotation of the first mechanical vibrator.

The angular velocity detection unit 20 further includes a synchronous detection circuit 23. The signal S21 and the signal S22 are input to the synchronous detection circuit 23. The synchronous detection circuit 23 synchronously detects the signal S22 by using the signal S21 as a synchronous detection reference signal (a reference of synchronous detection) and outputs a detection signal S23. More specifically, when the phase of the synchronous detection reference signal (signal S21) is aligned with the phase of the component I obtained by modulating the resonance frequency component by the angular velocity, and the synchronous detection of the signal S22 is performed by using the synchronous detection reference signal, the angular velocity component (desired signal) is demodulated and shifts to a frequency at the low frequency side, and the component Q by the quadrature error (disturbance signal) shifts to a frequency that is twice the resonance frequency f. The detection signal S23 includes a signal corresponding to the desired signal (baseband component) and a signal corresponding to the disturbance signal (high-frequency component).

The angular velocity detection unit 20 further includes a moving average filter 24 and a calculation unit (circuitry) 25.

In the present embodiment, an analog moving average filter that performs an analog moving average process is used as the moving average filter 24. A sampling clock signal (reference clock signal) S30 is input to the moving average filter 24. The sampling clock generation circuit 30 generates the sampling clock signal S30. The moving average filter 24 continues an analog moving average process on the detection signal S23 according to the sampling clock signal S30 for a period set based on the signal S21. A large capacitor element is unnecessary in implementation of the moving average process, and thus the moving average filter 24 can be easily downsized.

Figure 2:
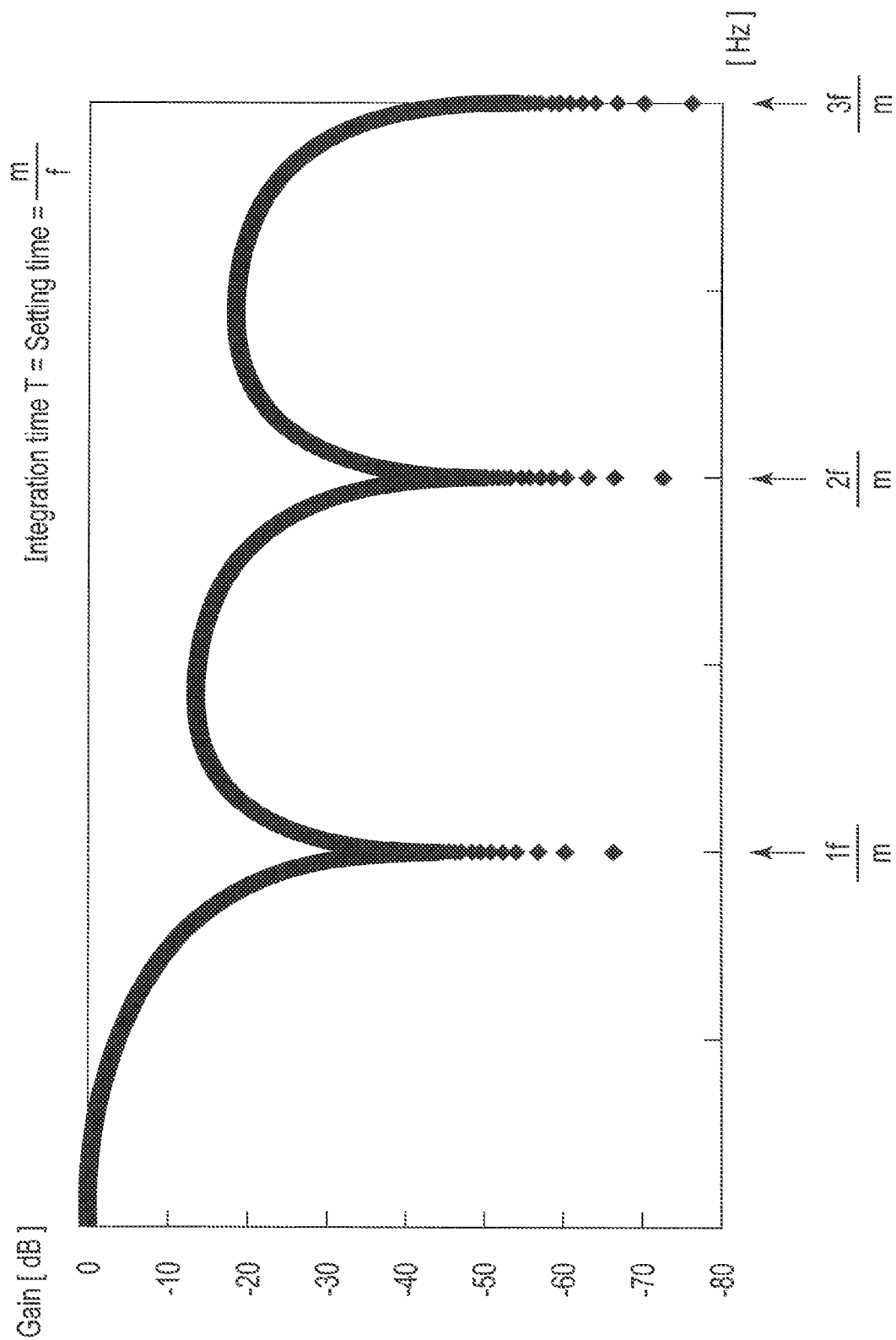
FIG. 2 is a diagram illustrating the characteristics of a moving average filter.

As illustrated in FIG. 2, the moving average filter 24 has a low-pass filter characteristic and has a notch characteristic at an f/m (m is a positive integer)-fold frequency, so that the moving average filter 24 does not remove the angular velocity component (desired signal) shifted to the frequency at the low frequency side, but removes the component Q (disturbance signal) shifted to the frequency that is twice the resonance frequency f. Consequently, an output signal S24 of the moving average filter 24 includes the angular velocity component (desired signal) shifted to the frequency at the low frequency side, but does not include the component Q (disturbance signal) shifted to the frequency that is twice the resonance frequency f.

After the moving average process by the moving average filter 24 is completed, the catch and release mechanism 13 catches the first mechanical vibrator 11, and the first mechanical vibrator 11 stops while storing the vibration energy. At this time, the first control unit 41 controls the catch and release mechanism 13.

The signal S24 is input to the calculation unit 25. The calculation unit 25 calculates an angular velocity corresponding to the force for rotating the first mechanical vibrator 11 based on the signal S24.

The first control unit 41 controls the mechanical vibration mechanism 10. More specifically, the first control unit 41 controls the catch and release mechanism 13 such that vibration of the first mechanical vibrator 11 in the first direction D1 starts in synchronization with the sampling clock signal S30. The second control unit 42 controls the angular velocity detection unit 20. For example, the second control unit 42 controls on/off of the operations of the elements 21 to 25 that constitute the angular velocity detection unit 20.

Although the mechanical vibration mechanism 10 and the angular velocity detection unit 20 are controlled by the first control unit 41 and the second control unit 42, respectively, the mechanical vibration mechanism 10 and the angular velocity detection unit 20 may be controlled by a single control unit.

Hereinbelow, the detector 1 of the present embodiment will be described in more detail.

The first position detection circuit 21 includes a first conversion circuit. The first conversion circuit converts a capacitance corresponding to the signal S11 into a voltage. The second position detection circuit 22 includes a second conversion circuit. The second conversion circuit converts a capacitance corresponding to the signal S12 into a current.

The synchronous detection circuit 23 includes a switch for switching a current path. The switch is controlled by the signal S21 (synchronous detection reference signal). The signal S21 is a current signal, which is further input to the moving average filter 24.

The moving average filter 24 includes an integrating circuit that includes an amplifier and a capacity and a switch for resetting the capacity. The integrating circuit performs an integrating operation (moving average process) when the switch is off. More specifically, the moving average filter 24 keeps the switch off for a period (a period set based on the first signal) that is M (M is a positive integer) times a cycle corresponding to the frequency (resonance frequency f) of the synchronous detection reference signal, and performs the integrating operation (moving average process) for the period that is M times the cycle. The period that is M times the cycle corresponding to the frequency of the synchronous detection reference signal is acquired, for example, by counting the number of clocks of the synchronous detection reference signal by using a counter.

Figure 3:
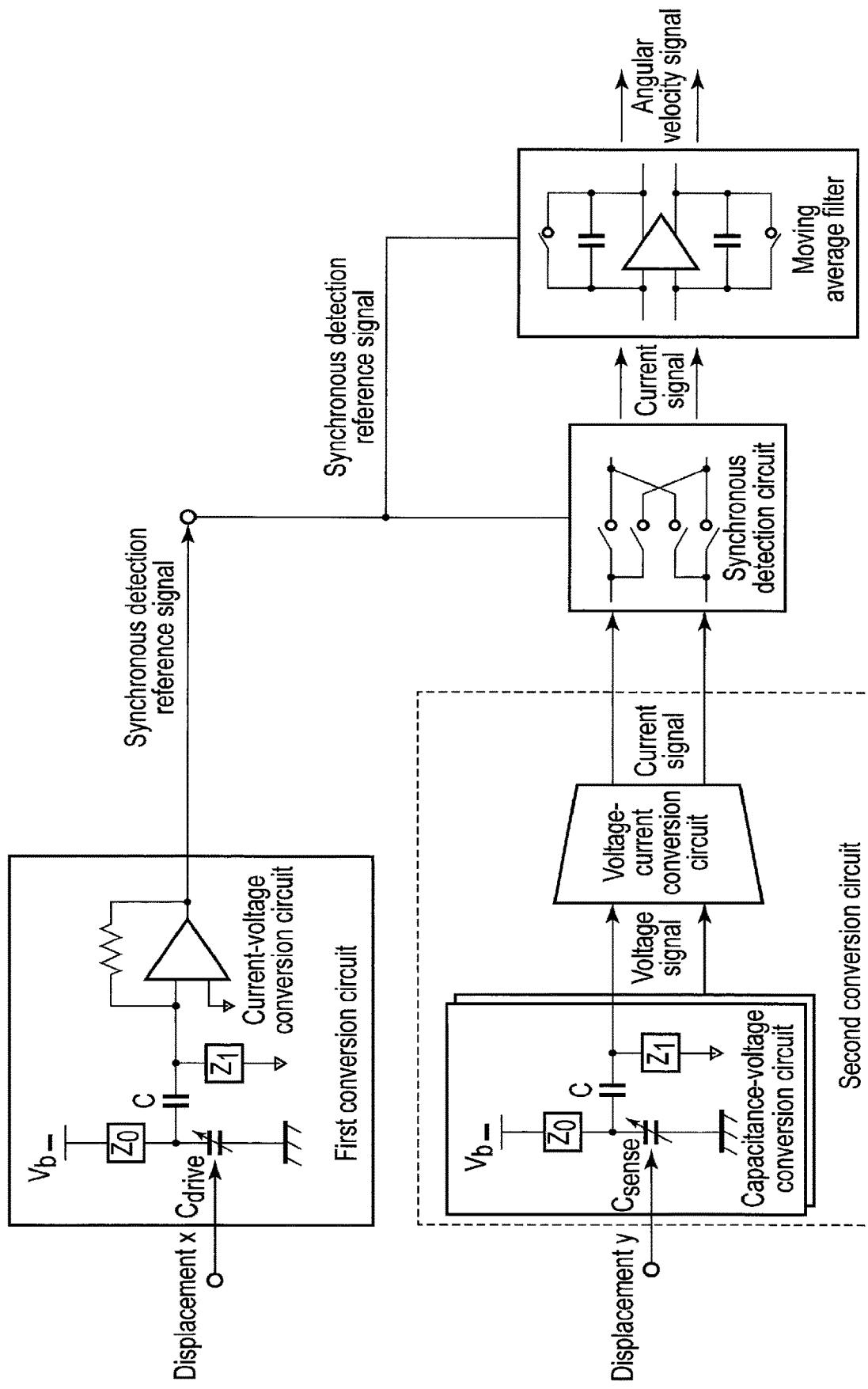
FIG. 3 is a diagram illustrating an example of an equivalent circuit of a first conversion circuit, a second conversion circuit, a synchronous detection circuit, and a moving average filter of the detector according to the first embodiment.

FIG. 3 is an example of an equivalent circuit of the first conversion circuit, the second conversion circuit, the synchronous detection circuit, and the moving average filter (the integrating circuit and the amplifier) described above.

The first conversion circuit includes a capacity $C_{drive}$ whose capacitance value changes according to the first position (displacement x) of the first mechanical vibrator 11, a high-impedance element $Z_0$ for applying a bias voltage $V_b$ to the capacity $C_{drive}$, a capacity C for voltage level shift, and a current-voltage conversion circuit.

Since the bias voltage $V_b$ is applied to the capacity $C_{drive}$, an electric charge corresponding to the product of a value of the bias voltage $V_b$ and a value of the capacity C is held in the capacity $C_{drive}$. Further, a voltage between the impedance element $Z_0$ and an input of the current-voltage conversion circuit is applied to the capacity C. In the case of $C \gg C_{drive}$, even when the capacitance value of the capacity $C_{drive}$ changes, the voltage applied to the capacity C does not change, that is, a voltage at a connection point between the capacity C and the capacity $C_{drive}$ does not change. When the capacitance value of the capacity $C_{drive}$ changes by a displacement of the first mechanical vibrator 11, $V_b \cdot (dC_{drive}/dt)$ is input, as a signal current, to the current-voltage conversion circuit through the capacity C, converted to a voltage signal, and output as a synchronous detection reference signal.

The second conversion circuit includes a capacity $C_{sense}$ whose capacitance value changes according to the position (displacement y) in the second direction of the second mechanical vibrator 12, a high-impedance element $Z_0$ for applying a bias voltage $V_b$ to the capacity $C_{sense}$, a capacity C for voltage level shift, a high-impedance element $Z_1$ for applying a predetermined voltage to the capacity C, and a voltage-current conversion circuit.

Since the bias voltage $V_b$ is applied to the capacity $C_{sense}$ through the high-impedance element $Z_0$, an electric charge corresponding to the product of a value of the bias voltage $V_b$ and a value of the capacity $C_{sense}$ is held in the capacity $C_{sense}$. Further, the bias voltage $V_b$ is applied to the capacity C through the impedance elements $Z_0$ and $Z_1$. In the case of $C \gg C_{sense}$, even when the capacitance value of the capacity $C_{sense}$ changes, the voltage applied to the capacity C does not change.

Even when the capacitance value of the capacity $C_{sense}$ changes by a displacement of the second mechanical vibrator 12, the amount of electric charge held by the $C_{sense}$ does not change. Thus, when differentiation is performed by $C_{sense}$, $0 = dQ/dC_{sense} = (dV_b/dC_{sense}) \cdot C_{sense} + V_b$ is satisfied. Consequently, $\Delta V_b = -V_b \cdot (dC_{sense}/C_{sense})$ is satisfied. Here, it is assumed that $dC_{sense}/C_{sense} \ll 1$. In this manner, the voltage applied to the capacity $C_{sense}$ changes such that the amount of electric charge held by the capacity $C_{sense}$ does not change even when the capacitance value of the capacity $C_{sense}$ changes by the displacement of the second mechanical vibrator 12. The voltage is applied, as a signal voltage, to the voltage-current conversion circuit through the capacity C, and a current signal (signal S22) is output.

Figure 4:
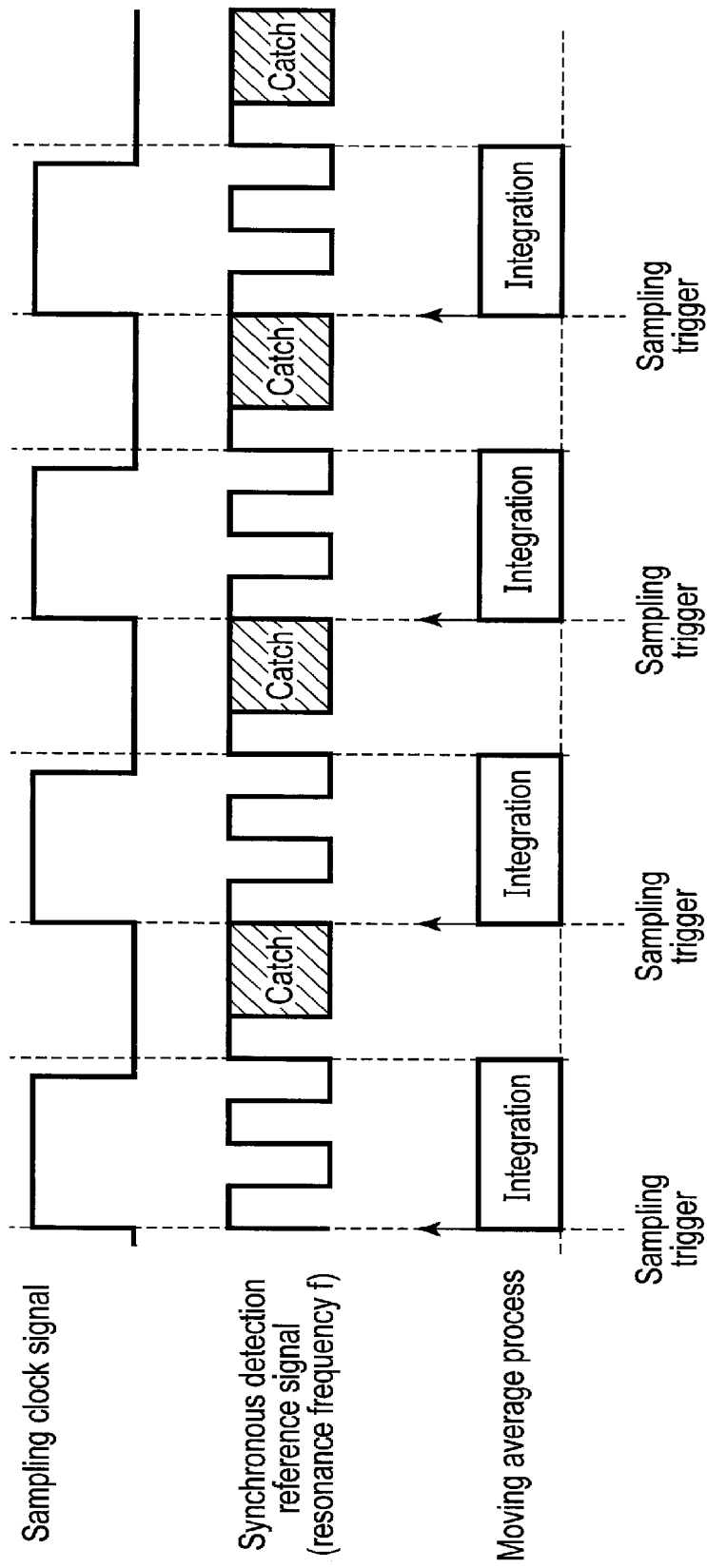
FIG. 4 is a timing chart for describing the operation of the detector according to the first embodiment.
Figure 5:
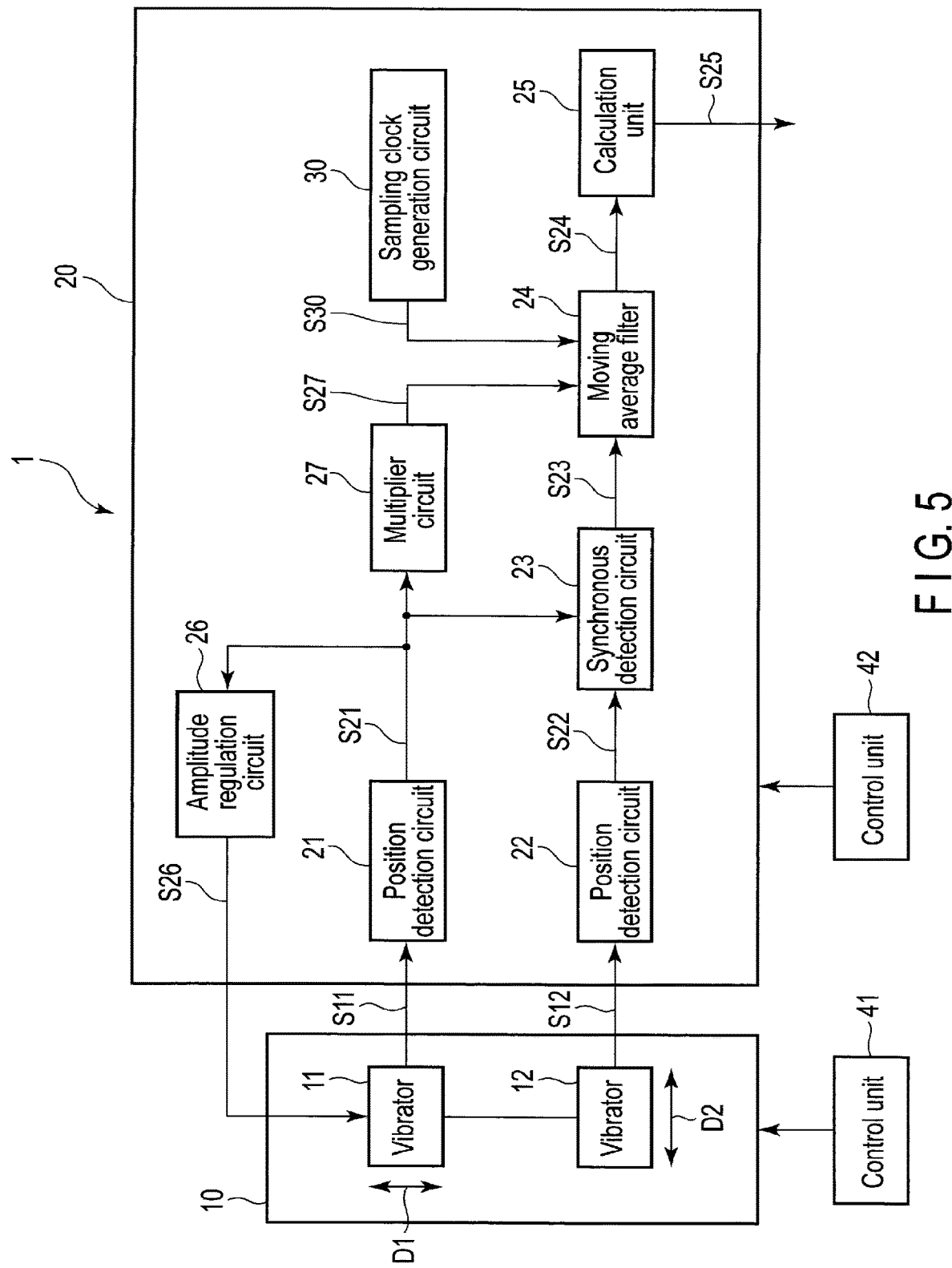
FIG. 5 is a diagram schematically illustrating a detector according to a second embodiment.

FIG. 4 is a timing chart for describing the operation of the detector 1 and illustrates the sampling clock signal, the synchronous detection reference signal, and a period during which the moving average filter performs the moving average process (integration).

The sampling clock signal is input to the first control unit 41. The first control unit 41 controls the catch and release mechanism 13 such that the first mechanical vibrator 11 is released in synchronization with the sampling clock signal. In the case of FIG. 4, the first mechanical vibrator 11 is released at a rising timing of a clock of the sampling clock signal (sampling trigger).

When the first mechanical vibrator 11 is released, the first mechanical vibrator 11 starts vibrating. In a period during which the first mechanical vibrator 11 vibrates, the output signal (S21) of the first position detection circuit 21 is the synchronous detection reference signal (resonance frequency f). In FIG. 4, a hatched period (catch) indicates a period during which the first mechanical vibrator 11 is caught. In this period, the output signal (S21) of the first position detection circuit 21 is zero.

The sampling clock signal is input also to the moving average filter 24. The moving average filter 24 starts a moving average process (integration) from the rising of the clock of the sampling clock signal. This moving average process (integration) is continued for a period set based on the synchronous detection reference signal. In the present embodiment, the above period is twice the cycle corresponding to the frequency of the synchronous detection reference signal. The above period is typically M (M is a positive integer) times the cycle (1/f) corresponding to the resonance frequency f.

The first control unit 41 controls the catch and release mechanism 13 such that the moving average filter 24 can continue the moving average process for the above period. That is, the catch and release mechanism 13 catches the first mechanical vibrator 11 for the above period by the control of the first control unit 41.

When the first control unit 41 controls the catch and release mechanism 13 such that the timing of releasing the first mechanical vibrator 11 becomes synchronous with the sampling clock signal in this manner, then as illustrated in FIG. 4, the start time of the integration by the moving average filter 24 becomes synchronous with the sampling clock signal, and thus the occurrence of sampling jitter is suppressed. The suppressing of the occurrence of sampling jitter results in increasing of an SN ratio of the output signal (signal S24) of the moving average filter 24, thereby suppressing the detection accuracy reduction.

When the moving average process by the moving average filter 24 is completed, the first control unit 41 stops the operation of at least one of the elements 11 to 13 that constitute the mechanical vibration mechanism 10, and the second control unit 42 stops the operation of at least one of the elements 21 to 24 that constitute the angular velocity detection unit 20. Accordingly, it is possible to achieve power saving in the detector 1. In order to sufficiently reduce power consumption, the operations of all of the elements 11 to 13 that constitute the mechanical vibration mechanism 10 are stopped, and the operations of all of the elements 21 to 24 that constitute the angular velocity detection unit 20 are stopped. Further, when the calculation of the angular velocity by the calculation unit 25 is completed, power saving similar to that in the case of the moving average filter 24 may be performed.

The element whose operation has been stopped starts operating again to acquire an angular velocity after an elapse of a certain period (an intermittent operation). In such an intermittent operation, when a common continuous time low-pass filter is used instead of the moving average filter 24, the order of the filter increases for removing an unnecessary component at twice the resonance frequency f of the first mechanical vibrator, and thus settling time increases. The moving average filter 24 is capable of performing filtering only in the integration period. Thus, the detector 1 that uses the moving average filter 24 is suitable for the intermittent operation.

Note that, FIG. 4 illustrates an example in which the integration (moving average process) is started from the rising of the clock of the sampling clock signal, however the integration (moving average process) may be started after an elapse of a certain time set based on the synchronous detection reference signal (resonance frequency f) after the rising of the clock of the sampling clock signal. Delaying the start of the integration from the rising of the clock of the sampling clock signal in this manner makes it possible to secure a time (setting time) until the element (circuit) whose operation has been stopped by the intermittent operation accurately starts operating and reduce an error in the acquired angular velocity. This contributes to prevention of reduction in the detection accuracy. The certain time set based on the synchronous detection reference signal is N (N is a positive integer) times the cycle corresponding to the frequency of the synchronous detection reference signal. The number of cycles is acquired, for example, by counting the number of clocks of the synchronous detection reference signal.

Second Embodiment

Figure 6:
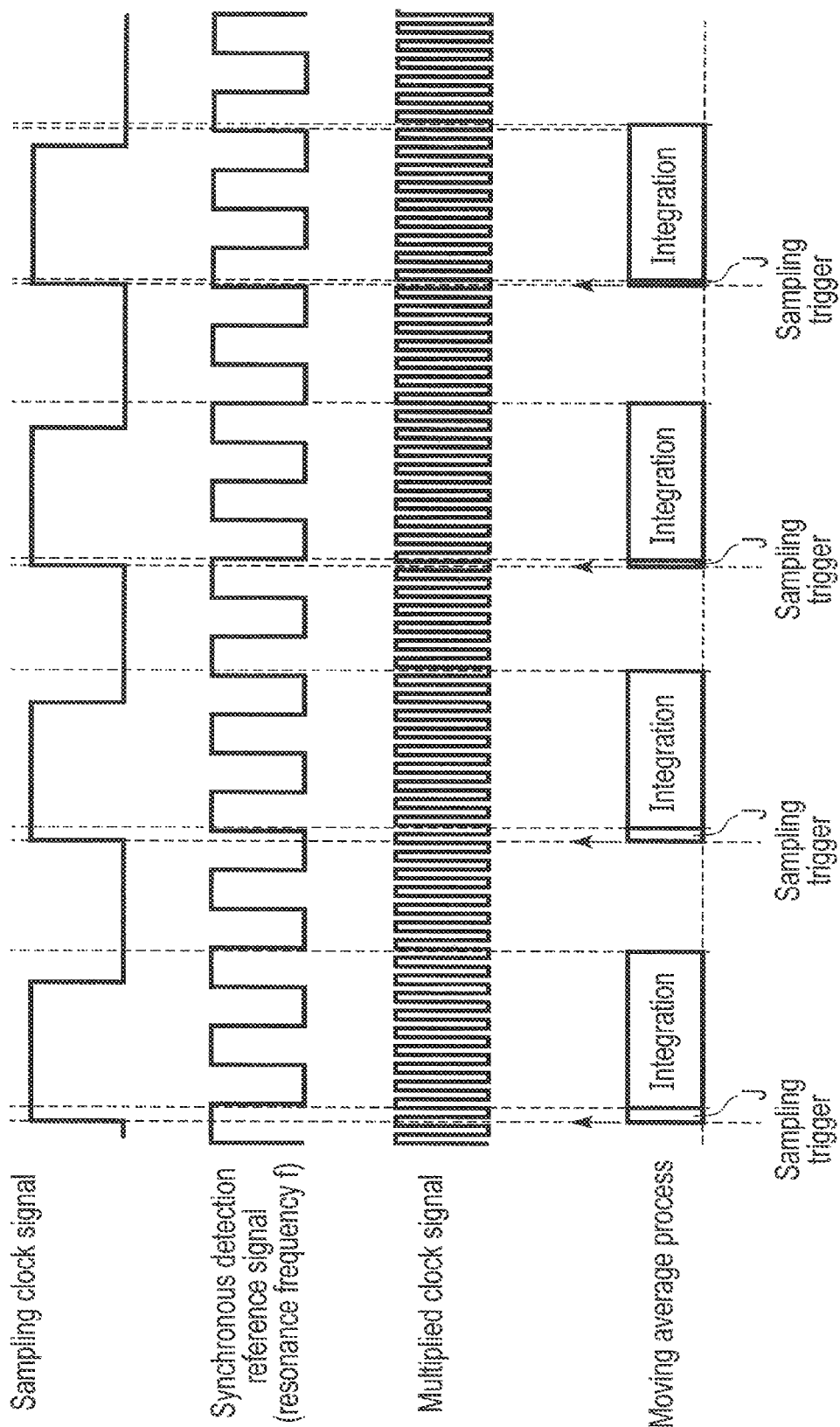
FIG. 6 is a timing chart for describing the operation of the detector according to the second embodiment.

FIG. 6 is a diagram schematically illustrating a detector 1 according to a second embodiment.

A first difference between the present embodiment and the first embodiment is that the present embodiment includes a multiplier circuit 27 that generates a signal (third signal) S27 having a frequency higher than the frequency (resonance frequency f) of a signal S21, and performs a moving average process for a period set based on the signal S27.

In the present embodiment, the signal S21 is input to the multiplier circuit 27. The multiplier circuit 27 multiplies the frequency of the signal S21 to generate the signal S27. Hereinbelow, the signal S27 is referred to as a multiplied clock signal.

Figure 7:
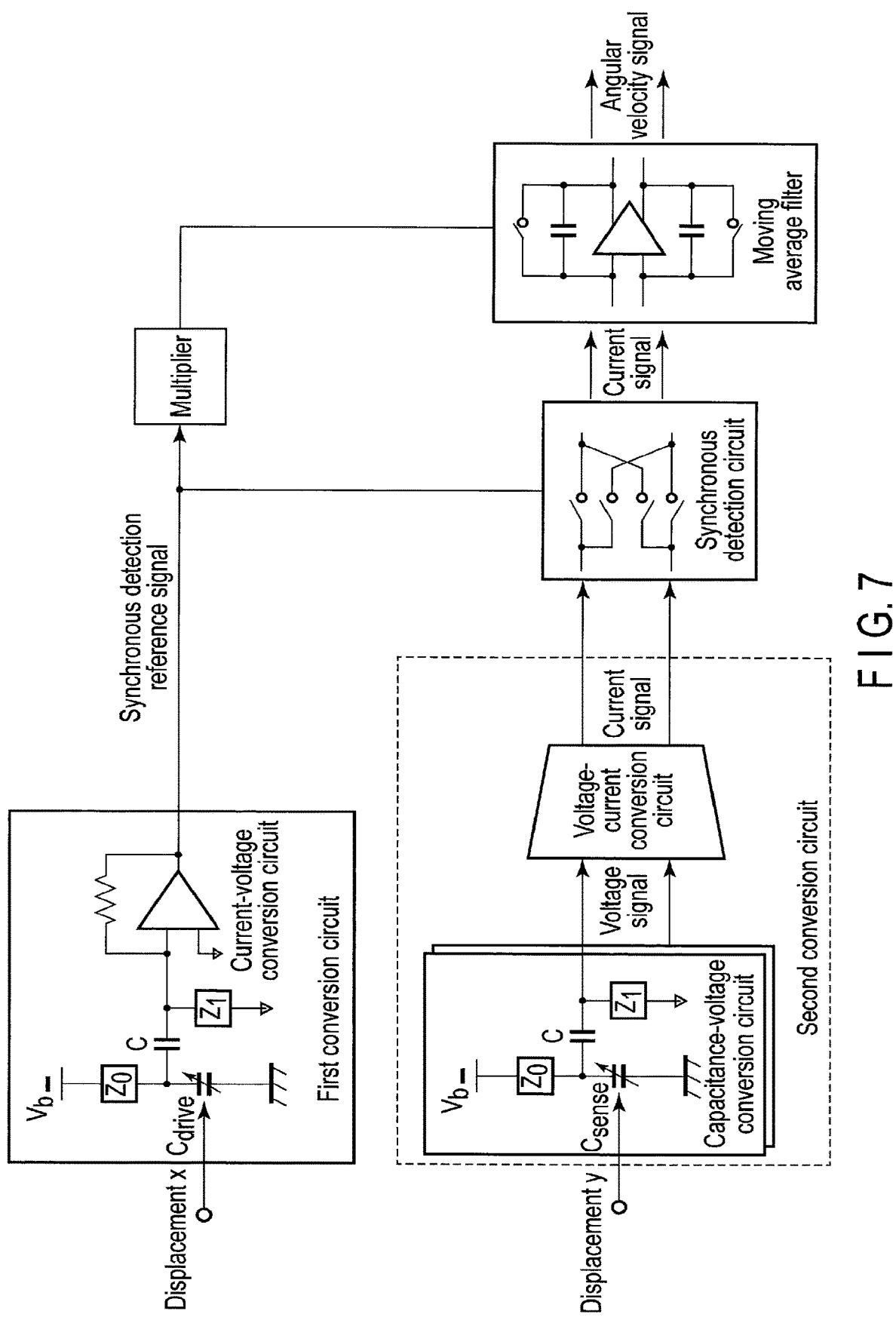
FIG. 7 is a diagram illustrating an example of an equivalent circuit of a first conversion circuit, a second conversion circuit, a synchronous detection circuit, and a moving average filter of the detector according to the second embodiment.

FIG. 7 is a timing chart for describing the operation of the detector 1 and illustrates a sampling clock signal, a synchronous detection reference signal, a multiplied clock signal, and a period during which a moving average filter performs a moving average process (integration). In FIG. 7, the multiplied clock signal is obtained by multiplying the synchronous detection reference signal by 4. In other words, a cycle of the multiplied clock signal is 1/P (P is an integer equal to or larger than 2) times a cycle of the synchronous detection reference signal.

In FIG. 7, the sampling clock signal and the synchronous detection reference signal are not synchronous with each other. In the present embodiment, after the rising of a clock of the sampling clock signal (sampling trigger), the moving average process (integration) is started from the rising of a clock of the multiplied clock signal, and then the started moving average process is continued for a period set based on the multiplied clock signal. Consequently, the jitter is compressed by an amount corresponding to the multiplying number compared to the case where the moving average process is continued for the period set based on the synchronous detection reference signal, and thus it is possible to reduce deterioration in the SN ratio caused by jitter.

Here, the period during which a moving average filter 24 performs the started moving average process (integration) is set based on the multiplied clock signal and, for example, Q (Q=P×M, M is a positive integer) times the cycle of the multiplied clock signal.

Note that, similarly to the first embodiment, the integration (moving average process) may be started after an elapse of a certain time set based on the multiplied clock signal after the rising of the clock of the sampling clock signal. The certain time set based the multiplied clock signal is R (R is a positive integer) times the cycle of the multiplied clock signal. The number of cycles is acquired, for example, by counting the number of clocks of the multiplied clock signal.

A second difference between the present embodiment and the first embodiment is that the present embodiment is not provided with the catch and release mechanism 13 and provided with an amplitude regulation circuit 26 for controlling a vibration amplitude of the first mechanical vibrator 11 to a certain magnitude instead of the catch and release mechanism 13. The amplitude regulation circuit 26 is constituted by using, for example, an amplitude detection circuit, a subtractor that subtracts a target amplitude from the detected amplitude, and a lowpass filter. The signal S21 is input to the amplitude regulation circuit 26. The amplitude regulation circuit 26 generates a signal S26 for controlling the vibration amplitude of the first mechanical vibrator 11 to a certain magnitude based on the input signal S21.

Similarly to the first embodiment, a first position detection circuit 21 includes a first conversion circuit that converts a capacitance to a voltage, a second position detection circuit 22 includes a second conversion circuit that converts a capacitance to a current, and a synchronous detection circuit 23 includes a switch that switches a current path. The moving average filter 24 includes an integrating circuit and a switch. FIG. 8 illustrates an example of an equivalent circuit corresponding to FIG. 3.

Note that, in the present embodiment, a sampling clock generation circuit 30 is provided inside an angular velocity detection unit 20, however, similarly to the first embodiment, the sampling clock generation circuit 30 may be provided outside the angular velocity detection unit 20. Conversely, the sampling clock generation circuit 30 of the first embodiment may be provided inside the angular velocity detection unit 20 similarly to the present embodiment. In addition, the detector that detects the angular velocity as the physical quantity has been described in each of the first and second embodiments, however a detector that detects a magnetic force as the physical quantity may be implemented in a similar manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detector comprising:
a vibration mechanism including a first mechanical vibrator vibrating in at least a first direction, a second mechanical vibrator mechanically connected to the first mechanical vibrator vibrating in at least a second direction perpendicular to the first direction, and a catch and release mechanism configured to catch the first mechanical vibrator in vibration and release the caught first mechanical vibrator to start vibration of the first mechanical vibrator;
a first circuit configured to detect a first position of the first mechanical vibrator in accordance with the first direction and output a first signal corresponding to the detected first position, the first signal including a first frequency;
a second circuit configured to detect a second position of the second mechanical vibrator in accordance with the second direction and output a second signal corresponding to the detected second position;
a detection circuit configured to detect the second signal by using the first signal as a reference of synchronous detection and output a detection signal;
a filter configured to continue on a moving average process on the detection signal according to a clock signal for a period set based on the first signal; and
a first controller circuitry configured to control the vibration mechanism to cause the first mechanical vibrator to start vibrating in the first direction by the catch and release mechanism in synchronization with the clock signal and continue the started vibration by the catch and release mechanism for the period during which the filter performs the moving average process.

2. The detector according to claim 1, wherein the period is M (M is a positive integer) times a cycle corresponding to the first frequency.

3. The detector according to claim 1, wherein the filter starts the moving average process after an elapse of a certain time set based on the first signal from a rising of a clock of the clock signal.

4. The detector according to claim 3, wherein the certain time is N (N is a positive integer) times a cycle corresponding to the first frequency.

5. The detector according to claim 1, wherein the first frequency is a resonance frequency of the first mechanical vibrator.

6. The detector according to claim 1, further comprising a generation circuit configured to generate the clock signal.

7. The detector according to claim 1, further comprising a calculation circuitry configured to calculate a physical quantity based on an output signal of the filter.

8. The detector according to claim 7, wherein the physical quantity is an angular velocity or a magnetic force.

9. The detector according to claim 1, further comprising a second control circuitry configured to control the first circuit, the second circuit, the detection circuit, and the filter.

10. The detector according to claim 9, wherein the second control circuitry stops an operation of at least one of the first circuit, the second circuit, the detection circuit, and the filter, and the first control circuitry stops the vibration in the first direction of the first mechanical vibrator.

11. The detector according to claim 1, wherein each of the first mechanical vibrator and the second mechanical vibrator is a movable electrode of a micro-electromechanical systems (MEMS) type variable capacitor.

12. The detector of claim 1, wherein the second mechanical vibrator vibrates in the second direction when a force for generating rotation acts on the vibration mechanism in a period during which the first mechanical vibrator vibrates in the first direction.

* * * * *